United States Patent [19]

Maass

[11] Patent Number: 4,968,372
[45] Date of Patent: Nov. 6, 1990

[54] METHOD OF PRODUCING A FLEXIBLE CARRIER SUBSTRATE

[75] Inventor: Heinz Maass, Hamburg, Fed. Rep. of Germany

[73] Assignee: Licentia Patent-Verwaltungs-GmbH, Frankfurt am Main, Fed. Rep. of Germany

[21] Appl. No.: 392,291

[22] Filed: Aug. 11, 1989

[30] Foreign Application Priority Data

Aug. 12, 1988 [DE] Fed. Rep. of Germany ....... 3827433

[51] Int. Cl.$^5$ ..................... B31B 31/16; H01L 31/02
[52] U.S. Cl. ................... 156/249; 156/247; 156/285; 156/344; 136/244; 136/256; 437/2
[58] Field of Search ............. 156/254, 247, 299, 249, 156/250, 344, 285; 428/409; 136/244, 256; 437/2

[56] References Cited

U.S. PATENT DOCUMENTS

| | | | |
|---|---|---|---|
| 2,587,171 | 2/1952 | Knewstubb et al. | 156/254 X |
| 4,192,494 | 3/1980 | Mima | 428/141 X |
| 4,287,382 | 9/1981 | French | 156/308.2 X |
| 4,401,710 | 9/1983 | Bansemir et al. | 136/245 X |
| 4,419,531 | 12/1983 | Lang et al. | 136/245 X |
| 4,542,257 | 9/1985 | Fraser et al. | 156/299 X |
| 4,680,074 | 7/1987 | Schmitz et al. | 136/244 X |
| 4,755,231 | 7/1988 | Kurland et al. | 136/244 |

FOREIGN PATENT DOCUMENTS 2160345 12/1971 Fed. Rep. of Germany.

*Primary Examiner*—Michael W. Ball
*Assistant Examiner*—Michele K. Yoder
*Attorney, Agent, or Firm*—Spencer & Frank

[57] ABSTRACT

A method of producing a flexible carrier substrate for a photovoltaic solar generator wherein a polyimide film disposed on a heatable lamination table is coated with an adhesive and hardened whereupon, after the application of an adhesion promoting layer, a glass filament fabric is placed onto the polyimide film and is subsequently saturated with a silicone adhesive. Resistance of the generator to atomic oxygen is obtained by performing the following method steps: (a) during the production of the substrate, a tear-away fabric is introduced into the not-yet-hardened silicone adhesive; (b) the laminate composed of polyimide film, glass filament fabric and tear-away fabric is hardened under vacuum; and (c) before the solar cells are glued onto the flexible carrier substrate, the tear-away fabric is removed in such a manner that a torn-open, structured silicone surface is produced onto which the solar cells of the generator can be glued.

9 Claims, 1 Drawing Sheet

METHOD OF PRODUCING A FLEXIBLE CARRIER SUBSTRATE

REFERENCE TO RELATED APPLICATIONS

This application claims the priority of Federal Republic of Germany application Ser. No. P 38 27 433.7 filed Aug. 12th, 1988, which is incorporated herein by reference.

BACKGROUND OF THE INVENTION

The present invention relates to a method of producing a flexible carrier substrate for a photovoltaic solar generator wherein a polyimide film, for example such a film sold under the trademark KAPTON, which is disposed on a heatable lamination table, is coated with an adhesive and hardened whereupon, after the application of an adhesion promoting layer, a glass filament fabric is placed onto the polyimide film and is subsequently saturated with a silicone adhesive.

A flexible solar generator is known in which a plurality of photoelectric solar cells are arranged on a substrate that can be wound into a roll. The solar cells are electrically conductively connected with one another in parallel and series connections by means of connectors punched out of a rolled material (see German Patent No. 2,160,345). The direction of winding of the substrate is the direction of the parallel connections, with separate connectors being provided for the parallel connections and for the series connections. The connectors are configured in such a manner that the direction in which their material was rolled is the direction in which the respective connections are made.

The required strength of this flexible solar generator system is realized with respect to the carrier material in that the windable substrate serving as the carrier is composed of a polyimide film to which glass filaments are glued. Several adhesives suitable for space travel conditions, for example thin-flowing adhesives which are stable up to 10 to 12 Torr and in a temperature range from −180° to 100° C. are selected, for example polyester adhesives containing a large amount of solvents so as to produce good wetting of the glass filament fabric and good adhesion of the fabric to the polyimide film. A layer of glass filament fabric is glued to the polyimide film in such a manner that initially the layer of glass filaments is placed onto the polyimide film and then the adhesive is applied in a very thin layer. After hardening of the adhesive, there results a substrate which is still sufficiently flexible but whose strength characteristics have been improved considerably. Instead of the above-mentioned adhesives, solvent-containing silicones can be employed for temperature ranges from −60° to +260° C. with which good bonds are realized between the glass filament fabric and the polyimide film. The solar cell modules and strings are glued to the resulting substrate by means of appropriate adhesives.

SUMMARY OF THE INVENTION

It is an object of the present invention to provide a method of producing a flexible carrier substrate for a photovoltaic solar generator which is resistant to atomic oxygen, in such a way that, it may preferably travel in an orbit about the Earth containing atomic oxygen percentages, without degradation.

This is accomplished according to the invention in a method in which a polyimide film (for example such a film sold by Dupont under the trademark KAPTON) disposed on a heatable lamination table, is coated with an adhesive and hardened, whereupon, after application of an adhesion promoting layer, i.e. primer, a woven glass filament fabric is placed onto the polyimide film to subsequently be saturated with a silicone adhesive, whereupon the following additional method steps are performed:

(a) after the glass filament fabric is saturated with silicone adhesive, but prior to the silicone adhesive being hardened, a woven tear-away fabric is introduced into the not yet hardened silicone adhesive;

(b) the laminate of polyimide film, silicone adhesive saturated-glass filament fabric and tear-away fabric is hardened under vacuum; and (c) before solar cells are glued onto the flexible carrier substrate, the tear-away fabric is removed in such a manner that a torn-open, structured silicone surface remains for attachment of the solar cells.

BRIEF DESCRIPTION OF THE DRAWINGS

These and other aspects of the invention will be more fully understood from the following detailed description of the preferred embodiments with reference to the accompanying drawing figures wherein.

DETAILED DESCRIPTION OF THE PREFERRED EMBODIMENT

Figure 1:
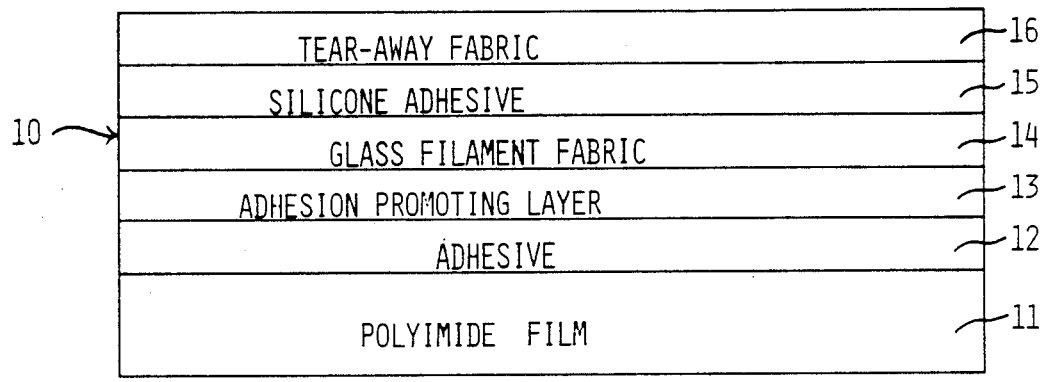
FIG. 1 is a cross-sectional view of a flexible carrier substrate produced according to the present invention prior to removal of a tear-away fabric.

Referring to FIG. 1, in accordance with the method of producing a flexible, windable, carrier substrate for photoelectric solar cells, according to the invention, a polyimide film 11, such as KAPTON (KAPTON is a registered trademark of Dupont), is disposed on a heatable lamination table. An adhesive 12 such as the Dayton Chemical Division of Whittaker Corporation adhesive Type 46970 a polyester adhesive is applied to the polyimide film, and hardened. Then a layer of woven glass filament fabric 14 is placed on the adhesive-coated polyimide film and is saturated with a silicone adhesive 15, such as RTVS 691 manufactured by Wacker Chemie of Munchen, Germany or DC 93500 manufactured by Dow Corning. Prior to placement of the glass filament fabric 14, a primer of Type G790 manufactured by Waker Chemic an adhesion promoter between silicone and substrates or DC 1200 manufactured by Dow Corning, which is a dilute solution of moisture reactive materials in VM and P Naptha, also an adhesion promotor between silicone and substrates, may be applied on the hardened adhesive 12.

Before the silicone adhesive 15 on the glass filament fabric 14 is hardened, a woven tear-away fabric 16 such as nylon 6.6 is applied into the silicone adhesive 15. Then, the laminate of polyimide film 11, hardened adhesive 12, adhesion promoting layer 13, glass filament fabric 14, silicone adhesive 15 and tear-away fabric 16 is subjected to a process under vacuum which hardens the silicone adhesive 15. For example, the silicone adhesive 15 in the laminate may be hardened for four hours under a pressure of 1 bar and at a temperature of 140° C.

Figure 2:
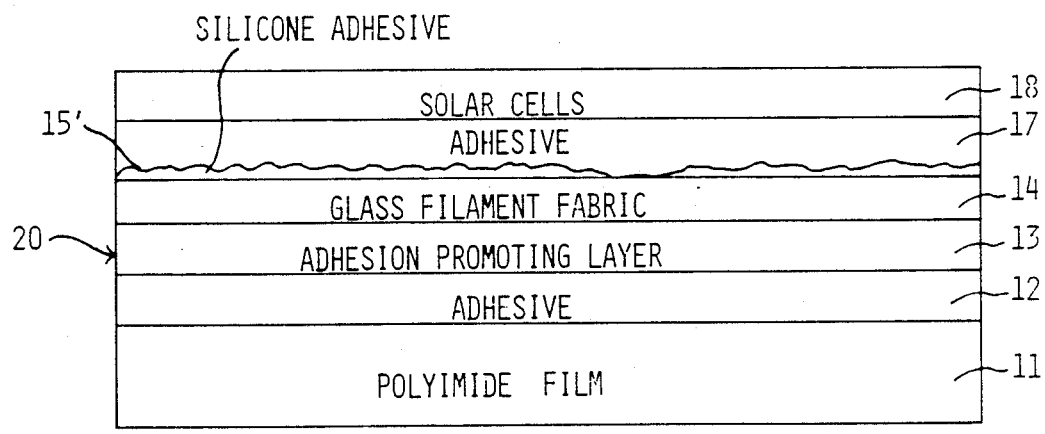
FIG. 2 is a cross-sectional view of the flexible carrier substrate produced according to the method of the invention after the tear-away fabric has been removed and solar cells have been applied with an adhesive.

The tear-away fabric 16 is then removed from the laminate in such a manner that a torn-open structured silicone surface 15' remains for attachment of the solar cells 18, as shown in FIG. 2. The solar cells 18 are then glued to torn-open structured silicone surface 15' with an adhesive 17 such as the above-mentioned RTVS 691 of Dow Corning. According to a further feature or the invention, application of the solar cells may be delayed for up to 24 hours after the tear-away fabric is removed from the laminate, but not more than 24 hours to avoid an uncleaned and unadhesive surface.

An advantage of the flexible carrier substrate manufactured in accordance with the method of the invention, in addition to providing a simple and cost-effective manufacturing process, resides in that solar cells can be attached to the hardened silicone surface by means of a silicone adhesive which is resistant to atomic hydrogen. Use of the invention for a photovoltaic solar generator to be used in an orbit about the Earth containing atomic oxygen percentages is thereby facilitated.

It will be understood that the above description of the present invention is susceptible to various modifications, changes and adaptations, and the same are intended to be comprehended within the meaning and range of equivalents of the appended claims.

The woven tear-away fabric 16 can be nylon 6.6 of the firm Interglas Textil GmbH with a thickness of 60±5 um, with a typical strength of 75±5 Newtons, with a breaking strength of 13, 5 Newtons per cm, and a threadcount of 68 per cm in warp-direction and a threadcount of 44 per cm in the weft-direction.

In the following list the manufacturer of the applied materials are named.

| Adhesive 12 | Type 46970 | | West Alexandria, Ohio |
|---|---|---|---|
| Silicone Adhesive 15 | RTVS 691 | Wacker Chemie | Munchen/Germany |
| Silicone Adhesive 15 | DC 93500 | Dow Corning | Midland/Michigan USA |
| Primer | Type G 790 | Wacker Chemie | Munchen/Germany |
| Primer | DC 1200 | Dow Corning | Midland/Michigan USA |

What is claimed is:

1. A method of producing a flexible carrier substrate for a photovoltaic solar generator, comprising the steps of:
   providing a synthetic film having a hardened coating of an adhesive on a surface thereof, an adhesion promoting layer on the coating, and a glass filament fabric on the adhesion promoting layer, the glass filament fabric being saturated with a silicone adhesive, the silicone adhesive being unhardened;
   introducing a tear-away fabric into the unhardened silicone adhesive;
   after said step of introducing, hardening the silicone adhesive under vacuum to produce a hardened laminate; and
   after the step of hardening, removing the tear-away fabric so that a torn-open, structured silicone surface remains on the laminate for adhesive attachment thereto of solar cells.

2. A method as in claim 1, further comprising the step of adhesively attaching the solar cells to the torn-open, structured silicone surface, with a silicone adhesive.

3. A method as in claim 2, wherein the step of providing the synthetic film comprises the steps of:
   providing a polyimide film on a heatable lamination table,
   coating the polyimide film on the table with an adhesive,
   hardening the coating to provide the hardened coating of adhesive,
   applying the adhesion promoting layer on the hardened coating,
   applying the glass filament fabric onto the adhesion promoting layer, and
   saturating the glass filament fabric with the silicone adhesive.

4. A method as in claim 2, wherein said step of removing the tear-away fabric is performed approximately 24 hours before said step of attaching.

5. A method as in claim 1, wherein the steps of providing the synthetic film comprises the steps of
   providing a polyimide film on a heatable lamination table,
   coating the polyimide film on the table with an adhesive,
   hardening the coating to provide the hardened coating of adhesive,
   applying the adhesion promoting layer on the hardened coating,
   applying the glass filament fabric onto the adhesion promoting layer, and
   saturating the glass filament fabric with the silicone adhesive.

6. A method as in claim 1, wherein said step of hardening the silicone adhesive comprises the step of hardening the silicone adhesive for approximately four hours under a pressure of approximately one bar and at a temperature of approximately 140° C.

7. A method as in claim 1, wherein the synthetic film is a polyimide film having a thickness in the range of one to five mils.

8. A method as in claim 1, wherein the tearaway fabric is a nylon having a thickness of 60±5 μm and a strength of 75±5 Newtons.

9. A method as in claim 8, wherein the tear-away fabric has a breaking strength of 13.5 Newtons per cm, a threadcount of 68 per cm in a warp direction and a threadcount of 44 per cm in a weft direction.

* * * * *